United States Patent
Lee et al.

(10) Patent No.: US 9,343,520 B2
(45) Date of Patent: May 17, 2016

(54) ORGANIC LIGHT-EMITTING DIODE DISPLAY AND METHOD OF FABRICATING THE SAME

(71) Applicant: LG DISPLAY CO., LTD., Seoul (KR)

(72) Inventors: YoungJang Lee, Seoul (KR); JiHye Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/586,399

(22) Filed: Dec. 30, 2014

(65) Prior Publication Data

US 2015/0187851 A1     Jul. 2, 2015

(30) Foreign Application Priority Data

Dec. 31, 2013   (KR) .................. 10-2013-0169300

(51) Int. Cl.
*H01L 29/08*     (2006.01)
*H01L 27/32*     (2006.01)

(52) U.S. Cl.
CPC .......... *H01L 27/3276* (2013.01); *H01L 27/326* (2013.01); *H01L 27/3211* (2013.01)

(58) Field of Classification Search
CPC ............. H01L 27/3276; H01L 27/326; H01L 27/3211

See application file for complete search history.

(56) References Cited

U.S. PATENT DOCUMENTS

2001/0022565 A1 *  9/2001  Kimura ................ G09G 3/3266
                                                               345/82
2005/0264498 A1 * 12/2005  Asano .................. G09G 3/3233
                                                               345/76

* cited by examiner

*Primary Examiner* — Shaun Campbell
(74) *Attorney, Agent, or Firm* — Birch, Stewart, Kolasch & Birch, LLP

(57) ABSTRACT

An organic light-emitting diode display can include an improved aperture ratio by configuring a circuit pattern between neighboring subpixels in a symmetrical fashion such that the subpixels share signal lines. Each pixel of the organic light-emitting diode display is formed in a symmetrical fashion with respect to one contact area, the number of reference connecting patterns can be reduced and therefore the area occupied by an opening area for each pixel can be made wider, thus leading to an improved aperture ratio.

18 Claims, 6 Drawing Sheets

ORGANIC LIGHT-EMITTING DIODE DISPLAY AND METHOD OF FABRICATING THE SAME

CROSS-REFERENCE TO RELATED APPLICATION

Pursuant to 35 U.S.C. §119(a), this application claims the benefit of earlier filing date and right of priority to Korean Application No. 10-2013-0169300, filed in the Republic of Korea on Dec. 31, 2013, the contents of which is incorporated by reference herein in its entirety.

BACKGROUND OF THE INVENTION

1. Field of the Invention

The present invention relates to an organic light-emitting diode display, and more particularly, to an organic electroluminescent display which offers an improved aperture ratio by configuring a circuit pattern between neighboring subpixels in a symmetrical fashion to allow the subpixels to share signal lines.

2. Discussion of the Related Art

Flat panel displays, proposed to replace the existing cathode-ray tube displays, include liquid crystal displays, field emission displays, plasma display panels, and organic light-emitting diode displays (OLED displays).

Among them, the OLED display is a self-emissive display in which an organic light-emitting diode provided on a display panel has high luminance and low operating voltage characteristics and emits light by itself. Hence, the OLED display has a high contrast ratio and can be made super-thin. Also, the OLED display can easily implement moving images due to its short response time of several microseconds ($\mu$s), has an unlimited viewing angle, and is stable at low temperatures.

Figure 1:
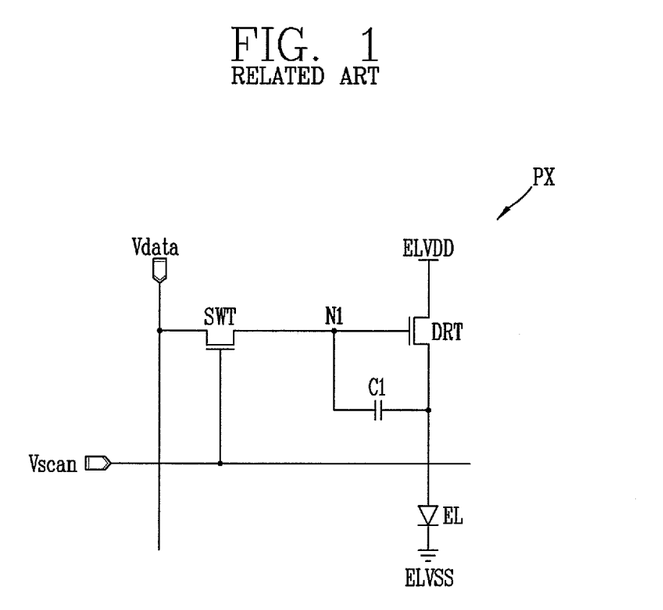
FIG. 1 is a view showing an equivalent circuit diagram of one pixel of an organic light-emitting diode display according to the related art.

FIG. 1 is a view showing an equivalent circuit diagram of one pixel of an organic light-emitting diode display according to the related art.

As illustrated therein, one pixel of the organic light-emitting diode display may consist of two thin film transistors SWT and DRT, a capacitor C1, and an organic light-emitting diode EL.

The switching thin film transistor SWT applies a data voltage Vdata to a first node 1 in response to a scan signal Vscan, and the driving thin film transistor DRT receives a driving voltage ELVDD from a source electrode and, upon application of the data voltage Vdata to the first node N1, applies a current corresponding to a gate-source voltage Vgs to the organic light-emitting diode EL. The capacitor C1 serves to maintain the voltage applied to a gate electrode during 1 frame.

The organic light-emitting diode EL is composed of an organic emitting layer situated between a cathode and an anode, the cathode being connected to a drain electrode of the driving thin film transistor DRT, and the cathode being connected to ground ELVSS. The organic emitting layer may consist of a hole transport layer, an emissive layer, and an electron transport layer.

The organic light-emitting diode display represents the gradient of an image by adjusting the amount of current flowing through the organic light-emitting diode by means of the driving thin film transistor DRT. Picture quality is determined by the characteristics of the driving thin film transistor DRT.

However, the threshold voltage and electron mobility of the driving thin film transistor may vary with each pixel, even within the same display panel, and different amounts of current may flow through each organic light-emitting diode EL, which makes it difficult to get a desired gradient by compensation.

Figure 2:
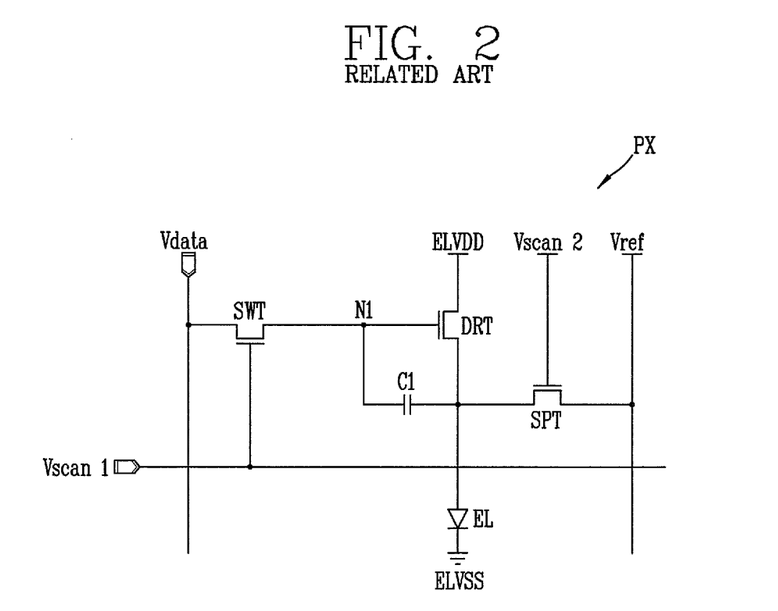
FIG. 2 is a view showing an equivalent circuit diagram of one pixel of an organic light-emitting diode display with a sampling thin film transistor that receives a reference voltage according to the related art.

To solve this problem, as shown in FIG. 2, a structure with one or more sampling thin film transistors SPT added to it to apply a reference voltage Vref has been recently proposed. In this structure, a reference voltage SPT is applied to the sampling thin film transistor SPT, the threshold voltage Vth and electron mobility $\mu$ of the driving thin film transistor DRT are sensed by a second scan signal Vscan2 having a similar waveform to that of the first scan signal Vscan1, and variations in the sensed threshold voltage Vth and electron mobility $\mu$ components of the driving thin film transistor DRT are compensated for by external compensation or internal compensation.

Figure 3:
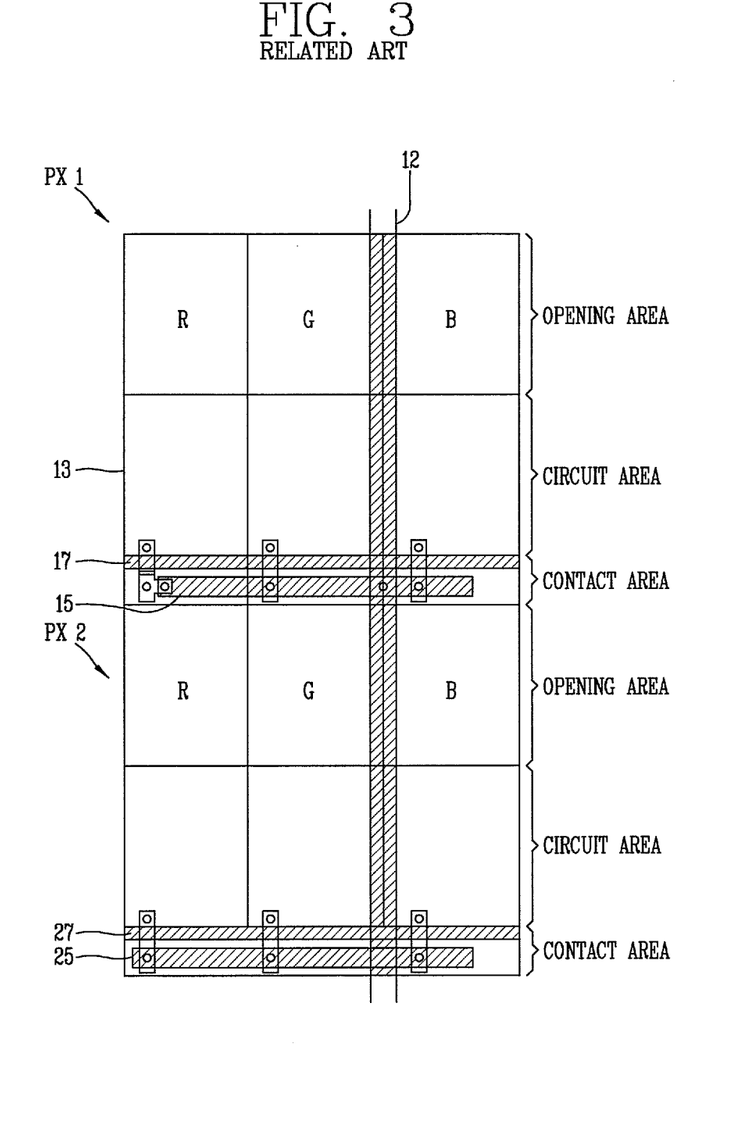
FIG. 3 is a view showing a pixel structure of an organic light-emitting diode display with a sampling thin film transistor according to the related art.

FIG. 3 is a view showing a pixel structure of an organic light-emitting diode display with a sampling thin film transistor according to the related art.

Referring to FIG. 3, the related art organic light-emitting diode display has a plurality of pixels PX1 and PX2 arranged regularly. One pixel PX1 is divided into a plurality of subpixels, and the subpixels include an opening area with an organic light-emitting diode that emit light of red (R), green (G), or blue (B), and a circuit area 13 connected to the organic light-emitting diode, and where a plurality of thin film transistors including a sampling thin film transistor are formed. Subpixels of another pixel PX2, vertically adjacent to the pixel PX1, also include an opening area and a circuit area, and are arranged side by side in the same structure as pixel PX1.

As stated above, each circuit area includes a sampling thin film transistor for sensing the threshold voltage of a driving thin film transistor. A reference voltage Vref supplied to the sampling thin film transistor is applied via a reference voltage line 12 assigned to each pixel. The reference voltage line 12 is formed on the same layer as a data line and a power voltage line, in parallel with them, taking the aperture ratio of the pixels PX1 and PX2 into consideration.

In FIG. 3, one reference voltage line 12 is formed for three subpixels of red (R), green (G), and blue (B) by way of example. The vertically adjacent pixels PX1 and PX2 receive the reference voltage Vref via the same reference voltage line 12.

With this structure, the reference voltage line 12 cannot be connected in a way that passes through the circuit section of each subpixel as it is formed on the same metal layer as a data line, etc. As such, a contact area is formed between the vertically adjacent two pixels PX1 and PX2, and a reference connecting pattern 15 or 25 is formed on the same metal layer as a gate electrode and a gate line 17 or 27 to supply the reference voltage Vref to one electrode of the sampling thin film transistor of each subpixel.

According to this structure, the related art organic light emitting diode display requires a contact area to form a reference voltage line 12 between vertically adjacent pixels PX1 and PX2. The contact area occupies part of the opening area for each pixel and the circuit area for each pixel is formed in a limited area, thereby causing a decrease in aperture ratio.

SUMMARY OF THE INVENTION

An aspect of the present invention is to minimize the area occupied by a contact area, where a reference connecting pattern for supplying a reference voltage to a sampling thin film transistor is formed, in each pixel of an organic light-emitting diode display.

One embodiment of the present invention provides an organic light-emitting diode display including: a plurality of pixels, each including an opening area where an organic light-emitting diode is formed and a circuit area connected to the opening area in vertical direction and having a plurality of thin film transistors, the plurality of pixels including vertically adjacent first and second pixels; and a contact area where a reference connecting pattern, connected to the thin film transistors of the first and second pixels to apply a reference voltage, is formed.

Another embodiment of the present invention provides a method of fabricating an organic light-emitting diode display having a plurality of pixels including the steps of: preparing a substrate; forming a gate metal layer including a gate line, a gate electrode, and a reference connecting pattern on the substrate; forming a data metal layer including a data line, source and drain electrodes, and a reference voltage supply line on the gate metal layer; electrically connecting the reference connecting pattern to the source and drain electrodes and the reference voltage supply line; and forming an organic light-emitting diode consisting of an anode, an organic emitting layer, and a cathode and overlying the data metal layer, to define each pixel of the plurality of pixels, wherein the pixels include two vertically adjacent pixels that are symmetrical with respect to the contact area at which the reference connecting pattern is formed.

According to embodiments of the present invention, as each pixel of an organic light-emitting diode display is formed in a symmetrical fashion with respect to one contact area, the number of reference connecting patterns can be reduced and therefore the area occupied by an opening area can be made wider, thus leading to an improved aperture ratio.

BRIEF DESCRIPTION OF THE DRAWINGS

The accompanying drawings, which are included to provide a further understanding of the invention and are incorporated in and constitute a part of this specification, illustrate embodiments and together with the description serve to explain the principles of the invention. In the drawings.

DETAILED DESCRIPTION OF THE INVENTION

Hereinafter, the configuration of an organic light-emitting diode display according to an embodiment of the present invention will be described with reference to the drawings.

Figure 4:
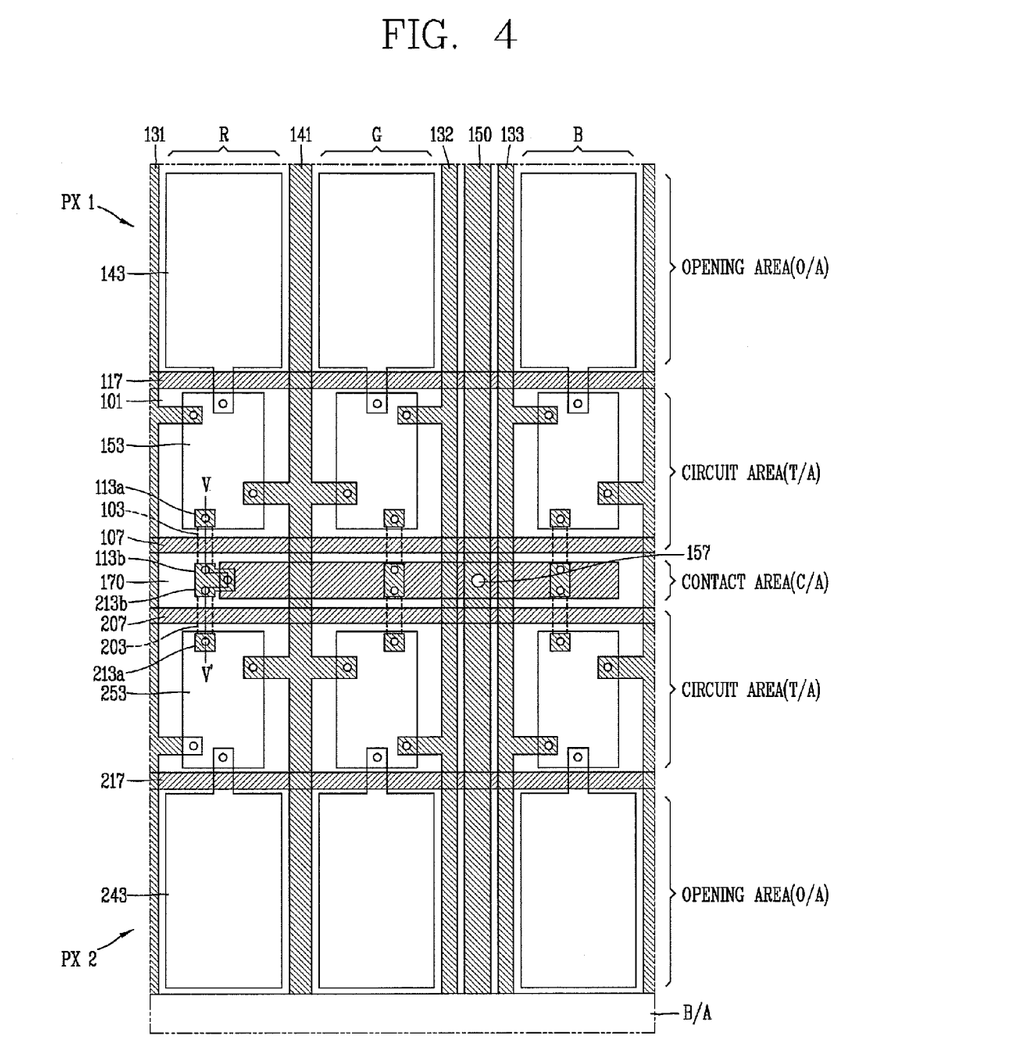
FIG. 4 is a view showing a pixel structure of an organic light-emitting diode display according to an embodiment of the present invention.
Figure 5:
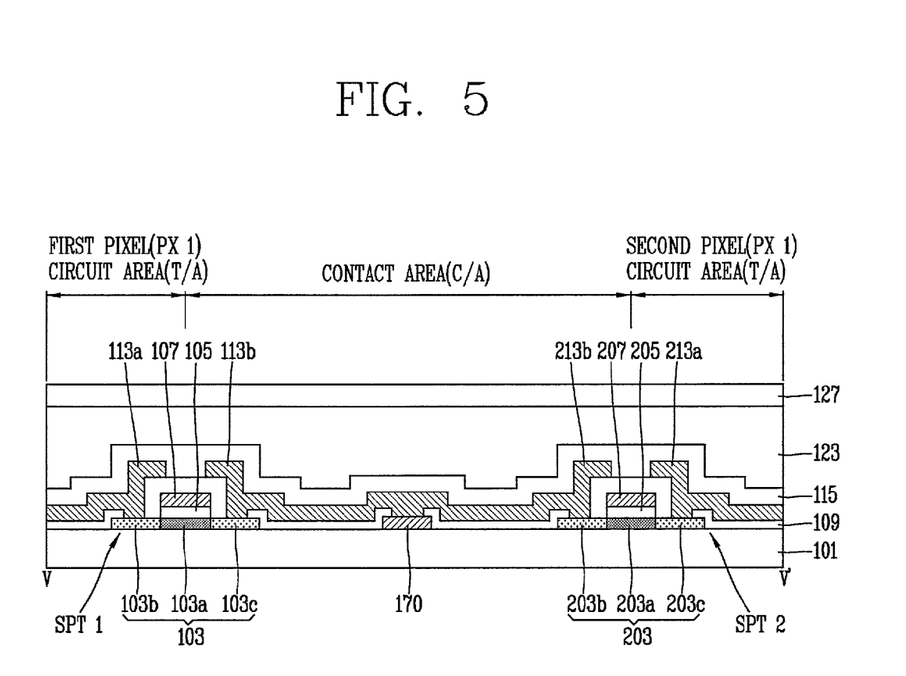
FIG. 5 is a view showing a cross-section of the part V-V' of FIG. 4.

FIG. 4 is a view showing a pixel structure of an organic light-emitting diode display according to an embodiment of the present invention. FIG. 5 is a view showing a cross-section of the part V-V' of FIG. 4. The drawings illustrate one example of a stripe structure where red, green, and blue subpixels R, G, and B are arranged by color in vertical direction.

Referring to FIGS. 4 and 5, the organic light-emitting diode display includes: a plurality of pixels PX1 and PX2, each including an opening area O/A where an organic light-emitting diode is formed and a circuit area T/A connected to the opening area O/A in vertical direction and having a plurality of thin film transistors, the plurality of pixels PX1 and PX2 include vertically adjacent first and second pixels PX1 and PX2; and a contact area C/A where a reference connecting pattern 170, connected to the thin film transistors of the first and second pixels PX1 and PX2 to apply a reference voltage Vref, is formed.

The same structure of the first and second pixels PX1 and PX2 is repeated on the part shown in the drawings.

Each pixel PX1 and PX2 includes three subpixels R, G, and B that emit three primary colors of red, green, and blue, and each subpixel R, G, and B is divided into an opening area O/A and a circuit area T/A.

The opening area O/A is an area where an organic light-emitting diode 143 or 243 corresponding to the three primary colors is formed to emit light forward and implement an image. Each organic light-emitting diode 143 or 243 includes a first electrode (hole injection electrode), an organic compound layer, and a second electrode (electron injection layer).

The organic compound layer includes an emission layer for actually emitting light, and may further include a variety of organic layers for efficiently delivering hole and electron carriers to an emitting layer, in addition to the emission layer. These organic layers may include a hole injection layer and a hole transport layer which are situated between the first electrode and the emission layer, and an electron injection layer and an electron transport layer which are situated between the second electrode and the emission layer.

The circuit area T/A is an area where a thin film transistor pattern 153 or 253 is formed to supply a current corresponding to an image to the organic light emitting diode 143 or 243. The thin film transistor pattern 153 or 253 can include a driving thin film transistor for applying current to the organic light emitting diode 143 or 243, a switching thin film transistor for supplying a data voltage corresponding to image data to the gate of the driving thin film transistor, and a sampling thin film transistor SPT1 or SPT2 that receives a reference voltage Vref and senses and compensates the threshold voltage and electron mobility of the driving thin film transistor. Thus, the thin film transistor pattern 153 or 253 can include at least three thin film transistors.

The thin film transistor pattern 153 or 253 is electrically connected to an R data line 131, a G data line 132, and a B data line 133 that are formed in vertical direction and apply corresponding data voltages to the subpixels R, G, and B. The thin film transistor pattern 153 or 253 is electrically connected to a power voltage supply line 141, formed in a direction parallel to the data lines 131 to 133, and gate lines 107, 117, 207, and 217, formed in a direction perpendicular to the power voltage supply line 141.

A contact area C/A, defined between the circuit areas T/A of the first and second pixels PX1 and PX2, has a reference connecting pattern 170 connected to the two thin film transistor patterns 153 and 253 to apply the reference voltage Vref. The reference voltage Vref is supplied from a reference voltage supply line 150 formed in a direction parallel to the power voltage supply line 141.

The data lines 131 to 133 and the power voltage supply line 141 are formed on the same metal layer, and the gate electrodes and the gate lines 107, 117, 207, and 217 and the reference connecting line 170 are formed on a gate metal layer underlying the data metal layer. Accordingly, the reference connecting pattern 170 is formed on a different layer from the reference voltage supply line 150, and electrically connected to the reference voltage supply line 150 via a contact hole 157 at the crossing point of the contact area C/A.

Although the figures illustrate an example where the power voltage supply line 141 is formed between the red subpixel R and the green subpixel G and the reference voltage supply line 150 is formed between the green subpixel G and the blue subpixel B, the present invention is not limited to this example and the two lines may replace each other as long as at least one power voltage supply line 141 and at least one reference voltage supply line 150 are allocated to each pixel PX1 and PX2.

Out of the gate electrodes and gate lines 107, 117, 207, and 217, the first and second gate electrodes 107 and 207 constitute the gate electrodes of the sampling thin film transistors SPT1 and SPT2 of the pixels PX1 and PX2, respectively, and are formed over the semiconductor layers 103 and 203 and electrically connected via contact holes to the drain electrode 113b of the first sampling thin film transistor SPT1 of the first pixel PX1 and the source electrode 213a of the sampling transistor SPT2 of the second pixel PX2, respectively. Since the source electrode 113b of the first sampling transistor SPT1 of the first pixel PX1 and the drain electrode 213b of the second sampling thin film transistor SPT2 of the second pixel PX2 are respectively connected to the thin film transistor patterns 153 and 253, they deliver a reference voltage Vref to the first and second pixels PX1 and PX2 by a second scan signal (Vscan2 of FIG. 2).

That is, in the organic light-emitting diode display according to an embodiment of the present invention, two vertically adjacent pixels PX1 and PX2 have a symmetrical structure with respect to the contact area C/A, and two electrodes of the sampling thin film transistors SPT1 and SPT2 respectively formed in the two pixels PX1 and PX2 are connected to the reference connecting pattern 170 at the contact area C/A. Thus, the two pixels PX1 and PX2 share the reference connecting pattern 170. Accordingly, a total of six subpixels are connected to one reference connecting pattern 170. The above embodiment illustrates a structure in which, the first pixel PX1 and the second pixel PX2 are symmetrical with respect to the reference connecting pattern 170, the organic light-emitting diode 143 included in the opening area O/A and the thin film transistor pattern 153 included in the circuit area T/A are all symmetrical, but the present invention is not limited to this structure the opening area O/A and circuit area T/A of the first pixel PX1 and the opening area O/A and circuit area T/A of the second pixel PX2 may be designed to have different internal structures.

That is, while the opening areas O/A and circuit areas T/A of the first and second pixels PX1 and PX2 are symmetrical with respect to the reference connecting pattern 170, the laminated structure of the organic light-emitting didoes 143 and thin film transistor pattern 153 formed in the opening areas O/A and circuit areas T/A, the connection structure of the gate lines 117 and 217, data line 131, and power voltage supply line 141, and other circuit pattern structures may differ between the first pixel PX1 and the second pixel PX2.

Accordingly, the organic light-emitting diode display according to an embodiment of the present invention includes only one contact area C/A for the two pixels PX1 and PX2 and an empty area B/A, when compared to the related art light-emitting diode display, and the dimensions of the opening area O/A may be increased depending on the width of the blank area B/A. The present invention can have a blank area that is about 7% greater than the related art.

Hereinafter, a method of fabricating a reference connecting pattern of an organic light emitting-diode display and a sampling thin film transistor connected to the reference connecting pattern according to an embodiment of the present invention will be described with reference to the drawings.

FIGS. 6A to 6F are process cross-section diagrams sequentially showing a method of fabricating an organic light-emitting diode display according to an embodiment of the present invention.

The method of fabricating an organic light-emitting diode display according to an embodiment of the present invention includes the steps of: preparing a substrate 101; forming a gate metal layer including a gate line 107, a gate electrode, and a reference connecting pattern 170 on the substrate 101; forming a data metal layer including a data line, source and drain electrodes 113a, 113b, 213a, and 213b, and a reference voltage supply line on the gate metal layer; electrically connecting the reference connecting pattern 170 to the source and drain electrodes 113a, 113b, 213a, and 213b and the reference voltage supply line; and forming an organic light-emitting diode, consisting of an anode, an organic emitting layer, and a cathode and overlying the data metal layer, to define a pixel. The pixel can include two vertically adjacent pixels PX1 and PX2 that are symmetrical with respect to the contact area C/A at which the reference connecting pattern 170 is formed.

Figure 6A:
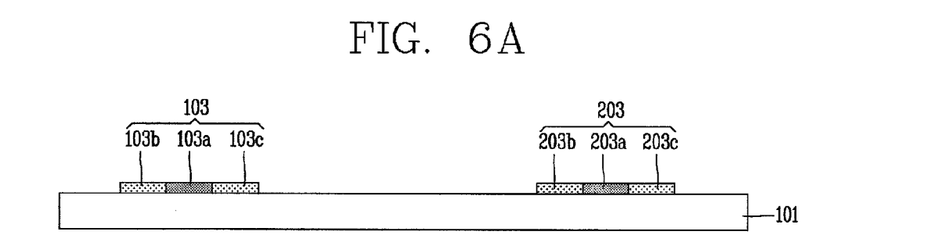
FIGS. 6A to 6F are process cross-section diagrams sequentially showing a method of fabricating an organic light-emitting diode display according to an embodiment of the present invention.

As shown in FIG. 6A, first, a buffer layer made of an insulating material, for example, an inorganic insulating material such as silicon oxide $SiO_2$ or silicon nitride SiNx, is formed on a transparent substrate 101 made of glass or plastic. The buffer layer may be omitted depending on the characteristics of the semiconductor layer 103 to be described later.

Subsequently, semiconductor layers 103, 203, made of pure polysilicon and consisting of first region 103a, 203a with the center forming channels and second regions 103b, 103c, 203b and 203c formed on either side of the first regions 103a, 203a and doped with a high concentration of an impurity, is formed on the buffer layer so as to correspond to the sampling thin film transistor areas of the first and second pixel PX1, PX2.

Figure 6B:
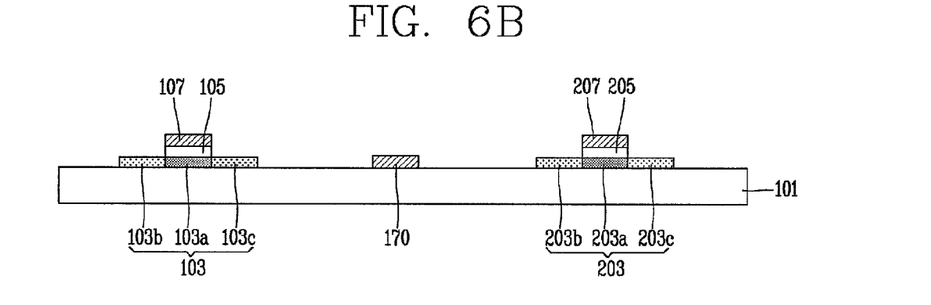

Then, as shown in FIG. 6B, a gate insulating film 105 is formed on the buffer layer including the semiconductor layer 103, 203, and then a gate metal layer including gate lines, gate electrodes 107, 207, and a reference connecting pattern 170 is formed on the gate insulating films 105, 205 so as to correspond to the first region 103a, 203a of the semiconductor layers 103, 203.

The gate lines, the gate electrodes 107, 207, and the reference connecting pattern 170 may have a single-layer structure made of a low-resistance metal, for example, either aluminum Al, aluminum alloy AlNd, copper Cu, copper alloy, molybdenum Mo, or molybdenum titanium MoTi, or a two-layer or three-layer structure made up of a combination of two or more metals. In the drawing, the gate lines, the electrodes 107, 207, and the reference connecting line 170 have a single-layer structure by way of example.

Figure 6C:
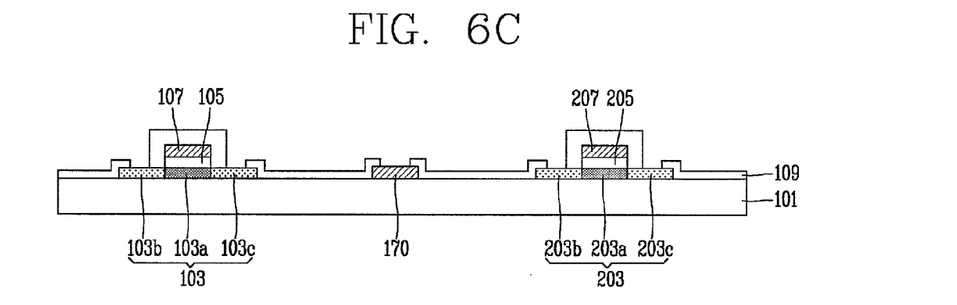

Next, as shown in FIG. 6C, an interlayer insulating film 109 made of an insulating material, for example, an inorganic insulating material such as silicon oxide $SiO_2$ or silicon nitride SiNx, is formed on the gate line 107, 207, the gate electrode, and the reference connecting pattern 170, over the entire surface of a display area.

Subsequently, the second region 103*b* and 103*c* situated on either side of the first region 103*a* of the semiconductor layer 103 is exposed by selectively patterning the insulating film 109 and the underlying gate insulating film 105.

Figure 6D:
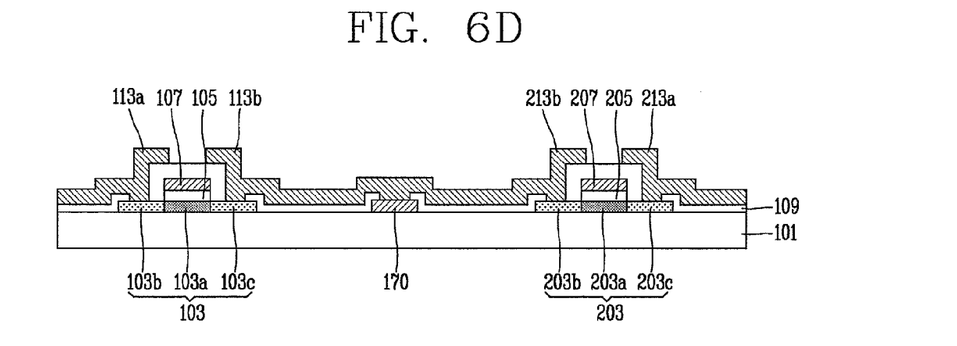

Next, as shown in FIG. 6D, a data metal layer is formed on the interlayer insulating film 109. The metal constituting the data metal layer may be either aluminum Al, aluminum alloy AlNd, copper Cu, copper alloy, molybdenum Mo, or molybdenum titanium MoTi, or at least two of them may be used.

The data metal layer includes a data line and a power voltage supply line separated by a predetermined distance from the data line.

Simultaneously with the data lines, source electrodes 113*a*, 213*a* and drain electrodes 113*b*, 213*b*, separated from each other, coming into contact with the second regions 103*b*, 203*b* and 103*c*, 203*c* exposed via a contact hole, and made of the same data metal as the data line, are formed on the insulating film 109. Although the drawing illustrate only the sampling thin film transistors SPT1 and SPT2, the driving thin film transistors and the switching thin film transistors have the same structure as the sampling thin film transistors SPT1 and SPT2. The source electrodes 113*a*, 213*a* and drain electrodes 113*b*, 213*b*, separated from the semiconductor layer 153, gate insulating film 113*a*, 213*a*, gate electrode 107, 207, and interlayer insulating film 109 that are sequentially laminated in the corresponding sampling thin film transistor area, constitute the sampling thin film transistor SPT1 of the first pixel PX1 and SPT2 of the second pixel PX2.

Although the drawing shows an example where the data line, the source electrodes 113*a*,213*a*, and the drain electrodes 113*b*, 213*b* all have a single-layer structure, these components may have a two-layer or three-layer structure made up of a combination of two or more different metals. In the drawing, the gate electrodes 107, 207, and the reference connecting line 170 have a single-layer structure by way of example.

Particularly, an embodiment of the present invention is illustrated with an example where each thin film transistor is a coplanar type having the semiconductor layer 103, 203 of polysilicon.

The sampling thin film transistors SPT1 and SPT2 of the first and second pixels PX1 and PX2 are symmetrical with respect to the contact area C/A.

Figure 6E:
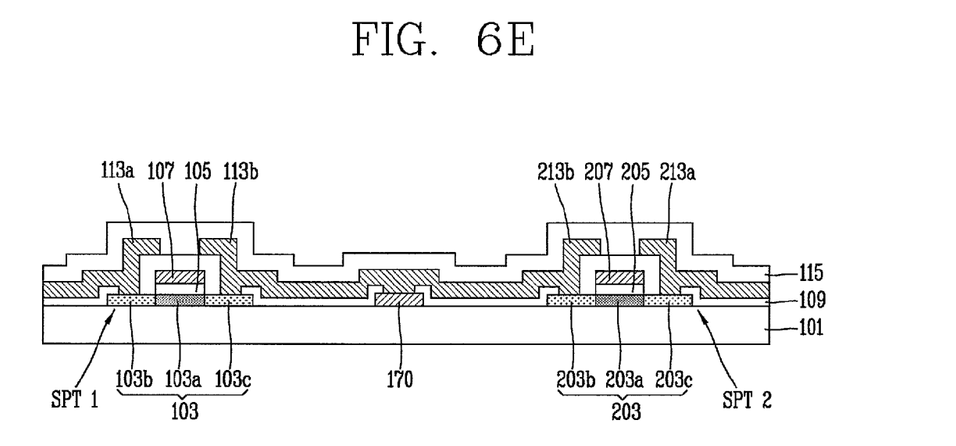

Next, as shown in FIG. 6E, an interlayer insulating film 115 is formed on the sampling thin film transistor SPT1. The interlayer insulating film 115 may be made of an insulating material, for example, an inorganic insulating material such as silicon oxide $SiO_2$ or silicon nitride $SiN_x$. Afterwards, an organic light-emitting diode, consisting of an anode, organic emitting layer, and a cathode and overlying the data metal layer, is formed on the interlayer insulating film 115.

Figure 6F:
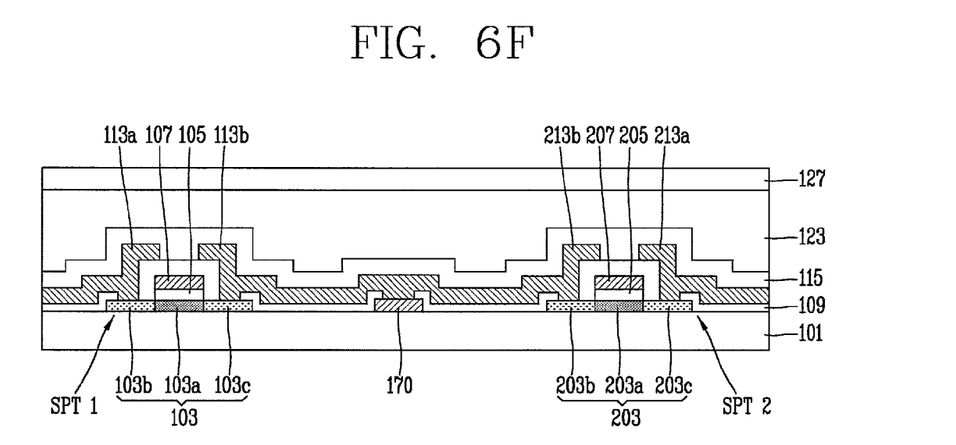

Then, as shown in FIG. 6F, a passivation layer 123 and a protective layer 127 are formed on the organic light-emitting diode, thereby implementing an organic light-emitting diode display.

While the foregoing descriptions contain many specific details, these specific details should not be construed as limitations on the scope of the invention, but rather as examples of a preferred embodiment thereof. Accordingly, the scope of the invention should be determined not by the embodiments illustrated, but by the appended claims and their equivalents.

What is claimed is:

1. An organic light-emitting diode display comprising:
   a plurality of pixels, each including an opening area where an organic light-emitting diode is included and a circuit area connected to the opening area in a vertical direction and having a plurality of thin film transistors, the plurality of pixels including vertically adjacent first and second pixels;
   a contact area including a reference connecting pattern connected to the thin film transistors of the first and second pixels to apply a reference voltage; and
   a power voltage supply line,
   wherein the power voltage supply line is perpendicular to the reference connecting pattern, and
   wherein the first and second pixels are symmetrical with respect to the contact area.

2. The organic light-emitting diode display of claim 1, wherein the plurality of thin film transistors comprises:
   a driving thin film transistor connected to the organic light-emitting diode;
   a switching thin film transistor connected to a gate of the driving thin film transistor; and
   a sampling thin film transistor connected between one electrode of the driving thin film transistor and an anode of the organic light-emitting diode to receive the reference voltage.

3. The organic light-emitting diode display of claim 2, wherein the reference connecting pattern is included on the same metal layer as a gate of the sampling thin film transistor.

4. The organic light-emitting diode display of claim 3, wherein the reference connecting pattern is connected via a contact hole to one electrode of the sampling thin film transistor.

5. The organic light-emitting diode display of claim 1, wherein the reference connecting pattern crosses a reference voltage supply line, disposed parallel to a data line connected to the thin film transistors, at the contact area, and is connected to the reference voltage supply line via a contact hole.

6. The organic light-emitting diode display of claim 5, wherein the reference voltage supply line is arranged between two subpixels selected from among red, green, and blue subpixels constituting each of the first and second pixels and arranged parallel to one another.

7. The organic light-emitting diode display of claim 6, wherein the reference connecting pattern is connected to the red, green, and blue subpixels of each of the first and second pixels.

8. The organic light-emitting diode display of claim 6, wherein the red and green subpixels are symmetrical with respect to a power voltage supply line.

9. A method of fabricating an organic light-emitting diode display, the method comprising:
   preparing a substrate;
   forming a gate metal layer including a gate line, a gate electrode, and a reference connecting pattern on the substrate;
   forming a data metal layer including a data line, source and drain electrodes, and a reference voltage supply line on the gate metal layer;
   electrically connecting the reference connecting pattern to the source and drain electrodes and the reference voltage supply line;
   forming an organic light-emitting diode, consisting of an anode, an organic emitting layer, and a cathode and overlying the data metal layer, to define each pixel of a plurality of pixels; and
   forming a power supply line on the substrate,
   wherein the power voltage supply line is perpendicular to the reference connecting pattern, and
   wherein the plurality of pixels include two vertically adjacent pixels that are symmetrical with respect to a contact area at which the reference connecting pattern is formed.

10. The method of claim 9, further comprising:

forming an opening area where the organic light-emitting diode is included; and forming a circuit area connected to the opening area in a vertical direction and having a plurality of thin film transistors for the plurality of pixels, respectively.

11. The method of claim 9, further comprising:

forming a plurality of thin film transistors for each pixel, wherein the plurality of thin film transistors comprises:

a driving thin film transistor connected to the organic light-emitting diode of each pixel;

a switching thin film transistor connected to a gate of the driving thin film transistor; and a sampling thin film transistor connected between one electrode of the driving thin film transistor and an anode of the organic light-emitting diode to receive the reference voltage.

12. The method of claim 11, wherein the reference connecting pattern is formed on the same metal layer as a gate of the sampling thin film transistor.

13. The method of claim 12, further comprising:

connecting the reference connecting pattern to one electrode of the sampling thin film transistor, via a contact hole.

14. The method of claim 9, wherein the reference connecting pattern crosses a reference voltage supply line, disposed parallel to a data line connected to a plurality of thin film transistors, at the contact area, and is connected to the reference voltage supply line via a contact hole.

15. The method of claim 14, wherein the reference voltage supply line is arranged between two subpixels selected from among red, green, and blue subpixels and arranged parallel to one another.

16. The method of claim 15, further comprising:

forming a power voltage supply line on the substrate, wherein the red and green subpixels are symmetrical with respect to the power voltage supply line.

17. The organic light-emitting diode display of claim 1, further comprising:

a reference voltage supply line disposed perpendicular to the reference connecting pattern and connected to the reference connecting pattern via a contact hole; and two data lines disposed between two adjacent subpixels, wherein the two data lines are respectively connected to the two adjacent subpixels, and wherein the two data lines and the two adjacent subpixels are symmetrical with respect to the reference voltage supply line.

18. The method of claim 9, further comprising:

forming a reference voltage supply line disposed perpendicular to the reference connecting pattern and connected to the reference connecting pattern via a contact hole, wherein the data metal layer includes two data lines disposed between two adjacent subpixels, wherein the two data lines are respectively connected to the two adjacent subpixels, and wherein the two data lines and the two adjacent subpixels are symmetrical with respect to the reference voltage supply line.

* * * * *